US009169562B2

(12) United States Patent
Sferlazzo et al.

(10) Patent No.: US 9,169,562 B2
(45) Date of Patent: *Oct. 27, 2015

(54) PARALLEL BATCH CHEMICAL VAPOR DEPOSITION SYSTEM

(75) Inventors: Piero Sferlazzo, Marblehead, MA (US); Darren M. Simonelli, Seabrook, NH (US)

(73) Assignee: Singulus MOCVD GMBH I. GR., Kahl am Main (DE)

( * ) Notice: Subject to any disclaimer, the term of this patent is extended or adjusted under 35 U.S.C. 154(b) by 625 days.

This patent is subject to a terminal disclaimer.

(21) Appl. No.: 13/469,515

(22) Filed: May 11, 2012

(65) Prior Publication Data
US 2012/0219713 A1    Aug. 30, 2012

Related U.S. Application Data

(63) Continuation-in-part of application No. 12/787,082, filed on May 25, 2010, now Pat. No. 8,986,451.

(51) Int. Cl.
C23C 16/00 (2006.01)
C23C 16/54 (2006.01)
(Continued)

(52) U.S. Cl.
CPC ........... *C23C 16/54* (2013.01); *C23C 16/45565* (2013.01); *C23C 16/45574* (2013.01);
(Continued)

(58) Field of Classification Search
CPC ................... H01L 21/68771; H01L 21/67109; H01L 21/6719
USPC ...................................................... 118/719
See application file for complete search history.

(56) References Cited

U.S. PATENT DOCUMENTS 3,602,192 A   8/1971   Grochowski et al.
3,805,736 A   4/1974   Foehring et al.
(Continued)

FOREIGN PATENT DOCUMENTS

JP         1050613       2/1998
KR      1020040046042    6/2004

OTHER PUBLICATIONS

Final Office Action in related U.S. Appl. No. 12/787,082, mailed on Jan. 27, 2014; 16 pages.
(Continued)

*Primary Examiner* — Gordon R Baldwin
*Assistant Examiner* — Charlee Bennett
(74) *Attorney, Agent, or Firm* — Schmeiser, Olsen & Watts LLP; William G. Guerin

(57) ABSTRACT

Described is a parallel batch CVD system that includes a pair of linear deposition chambers in a parallel arrangement and a robotic loading module disposed between the chambers. Each chamber includes a linear arrangement of substrate receptacles, gas injectors to supply at least one gas in a uniform distribution across the substrates, and a heating module for uniformly controlling a temperature of the substrates. The robotic loading module is configured for movement in a direction parallel to a length of each of the chambers and includes at least one cassette for carrying substrates to be loaded into the substrate receptacles of the chambers. The parallel batch CVD system is suitable for high volume processing of substrates. The CVD processes performed in the chambers can be the same process. Alternatively, the CVD processes may be different and substrates processed in one chamber may be subsequently processed in the other chamber.

4 Claims, 8 Drawing Sheets

(51) Int. Cl.
- *C23C 16/455* (2006.01)
- *C23C 16/46* (2006.01)
- *H01L 21/67* (2006.01)
- *H01L 21/687* (2006.01)

(52) U.S. Cl.
CPC ........... *C23C16/45578* (2013.01); *C23C 16/46* (2013.01); *H01L 21/6719* (2013.01); *H01L 21/67109* (2013.01); *H01L 21/68771* (2013.01)

(56) References Cited

U.S. PATENT DOCUMENTS

| | | | |
|---|---|---|---|
| 4,262,131 A | 4/1981 | Sih | |
| 4,579,080 A | 4/1986 | Martin et al. | |
| 4,823,736 A | 4/1989 | Post et al. | |
| 5,119,760 A | 6/1992 | McMillan et al. | |
| 5,366,554 A | 11/1994 | Kanai et al. | |
| 5,788,777 A | 8/1998 | Burk, Jr. | |
| 5,958,140 A | 9/1999 | Arami et al. | |
| 6,197,121 B1 | 3/2001 | Gurary et al. | |
| 6,416,579 B1 | 7/2002 | Thallner | |
| 6,578,515 B2 | 6/2003 | Sakamoto et al. | |
| 6,843,892 B1 | 1/2005 | McLeod | |
| 6,860,965 B1 * | 3/2005 | Stevens | 156/345.32 |
| 6,886,244 B1 | 5/2005 | McLeod et al. | |
| 7,041,202 B2 | 5/2006 | McLeod | |
| 7,153,368 B2 | 12/2006 | Preti et al. | |
| 7,270,510 B2 * | 9/2007 | Putzi | 414/226.05 |
| 8,303,713 B2 | 11/2012 | Belousov et al. | |
| 2002/0033133 A1 | 3/2002 | Klein et al. | |
| 2002/0069827 A1 | 6/2002 | Sakamoto et al. | |
| 2003/0061989 A1 | 4/2003 | Kamimura | |
| 2003/0072882 A1 | 4/2003 | Ninisto et al. | |
| 2004/0067641 A1 | 4/2004 | Yudovsky | |
| 2006/0126701 A1 | 6/2006 | Nozawa et al. | |
| 2006/0144335 A1 | 7/2006 | Lee et al. | |
| 2007/0077355 A1 | 4/2007 | Chacin et al. | |
| 2008/0213477 A1 | 9/2008 | Zindel et al. | |
| 2008/0251020 A1 | 10/2008 | Franken | |
| 2009/0017190 A1 | 1/2009 | Sferlazzo et al. | |
| 2009/0042394 A1 | 2/2009 | Yamazaki et al. | |
| 2009/0098276 A1 | 4/2009 | Burrows et al. | |
| 2010/0291308 A1 | 11/2010 | Sferlazzo et al. | |
| 2013/0270362 A1 | 10/2013 | Sferlazzo et al. | |

OTHER PUBLICATIONS

First Office Action in related Japanese Patent Application No. 201180033855.9, mailed on Apr. 1, 2014; 11 pages.

Non-Final Office Action in related U.S. Appl. No. 12/787,082, mailed on Feb. 11, 2013; 17 pages.

International Search Report and Written Opinion in related international application No. PCT/US2011/036167, mailed on Jan. 9, 2012; 10 pages.

Final Office Action in related U.S. Appl. No. 12/787,082, mailed on May 15, 2013; 15 pages.

Non-Final Office Action in related U.S. Appl. No. 12/787,082, mailed on Jul. 15, 2014; 17 pages.

International Search Report & Written Opinion in related international patent application No. PCT/US14/35812, mailed on Sep. 5, 2014; 7 pages.

Non-Final Office Action in related U.S. Appl. No. 12/787,082, mailed on Aug. 29, 2013; 16 pages.

First Office Action in related Korean patent application No. 10-2012-7033164, mailed on Oct. 6, 2014; 16 pages.

Second Office Action in related Chinese patent application No. 201180033855.9, mailed on Nov. 19, 2014; 14 pages.

Notice of Allowance in related U.S. Appl. No. 12/787,082, mailed on Nov. 5, 2014; 8 pages.

Office Action in related Korean Patent Application No. 10-2012-7033164, mailed on Apr. 8, 2015; 8 pages.

* cited by examiner

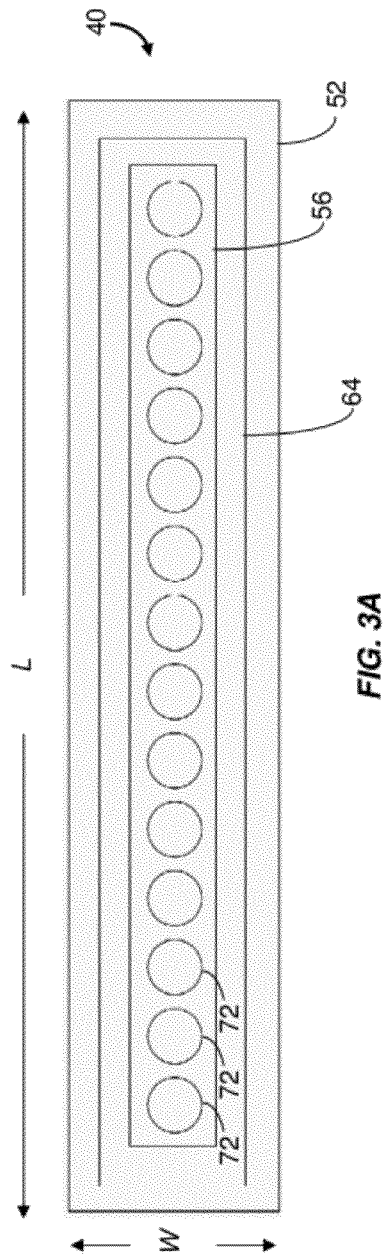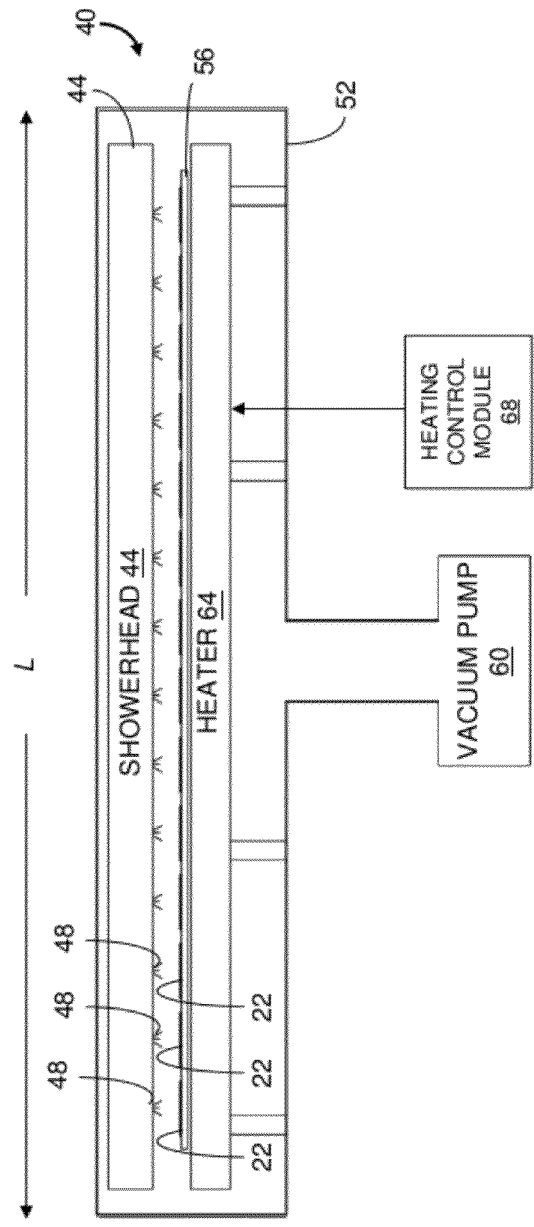

PARALLEL BATCH CHEMICAL VAPOR DEPOSITION SYSTEM

RELATED APPLICATION

This application is a continuation-in-part application of U.S. patent application Ser. No. 12/787,082, titled "Linear Batch Chemical Vapor Deposition System" and filed May 25, 2010.

FIELD OF THE INVENTION

The invention relates generally to a system and method for chemical vapor deposition. More particularly, the invention relates to a chemical vapor deposition system for linear batch processing of substrates.

BACKGROUND

Chemical vapor deposition (CVD) is a process frequently used to deposit semiconductor, dielectric, metallic and other thin films onto a surface of a substrate. In one common CVD technique, one or more precursor molecules, each in a gas phase, are introduced into a process chamber that includes the substrate. The reaction of these precursor gases at the surface of the substrate is initiated or enhanced by adding energy. For example, energy can be added by increasing the surface temperature of the substrate or by exposing the surface to a plasma discharge or ultraviolet (UV) radiation source.

The quality of a film deposited by a CVD reaction occurring in the gas phase depends significantly on the uniformity of the precursor gases at the substrate. Non-uniform gas near the substrate surface can yield unsatisfactory film uniformity and can lead to shadowing artifacts due to features on the surface, such as steps and vias. High volume processing of wafers and other substrates is limited by known systems and methods for CVD processing. Complex rotational mechanisms are often employed and the size of conventional reaction chambers limits the number of substrates per CVD process batch.

SUMMARY

In one aspect, the invention features a parallel batch CVD system. The system includes a pair of linear deposition chambers in a parallel arrangement and a robotic loading module between the linear deposition chambers. Each linear deposition chambers includes a linear arrangement of a plurality of substrate receptacles each configured to receive a substrate. Each linear deposition chamber further includes a plurality of gas injectors to supply at least one gas in a uniform distribution across substrates disposed in the substrate receptacles and a heating module to uniformly controlling a temperature of the substrates disposed in the substrate receptacle. The robotic loading module is configured to move in a direction parallel to a length of each of the linear deposition chambers. The robotic loading module includes at least one cassette for carrying substrates to be loaded into the substrate receptacles of the linear deposition chambers.

In another aspect, the invention features a method for CVD. A robotic loading module is translated between a pair of linear deposition chambers in parallel arrangement. The translation is along a path that is parallel to a length of the linear deposition chambers. A plurality of substrates is loaded from the translating robotic loading module into each of the linear deposition chambers. The substrates are heated in each linear deposition chamber to a temperature that is substantially equal to a temperature of each of the other substrates in the linear deposition chamber. A plurality of gases is supplied in a uniform distribution across the substrates in each linear deposition chamber. The thickness and composition of a film deposited on each substrate are substantially equal to the thickness and composition of a film deposited on each of the other substrates in the linear deposition chamber.

In yet another aspect, the invention features a method for CVD. A plurality of substrates is loaded from a robotic loading module into a first linear deposition chamber during a first translation of the robotic loading module between the first linear deposition chamber and a second linear deposition chamber. The first and second linear deposition chambers are in a parallel arrangement and the translation is along a path that is parallel to a length of the first and second linear deposition chambers. The substrates in the first linear deposition chamber are heated to a temperature that is substantially equal to a temperature of each of the other substrates in the first linear deposition chamber. A plurality of gases is supplied in a uniform distribution across the substrates in the first linear deposition chamber. A thickness and a composition of a film deposited on each substrate are substantially equal to a thickness and a composition of a film deposited on each of the other substrates in the first linear deposition chamber. The substrates are extracted from the first linear deposition chamber during a second translation of the robotic loading module along the path. The substrates are loaded from the robotic loading module into the second linear deposition chamber during a translation of the robotic loading module between the first and second linear deposition chambers along the path. The substrates are heated in the second linear deposition chamber to a temperature that is substantially equal to a temperature of each of the other substrates in the second linear deposition chamber. A plurality of gases is supplied in a uniform distribution across the substrates in the second linear deposition chamber. A thickness and a composition of a film deposited on each substrate are substantially equal to a thickness and a composition of a film deposited on each of the other substrates in the second linear deposition chamber.

BRIEF DESCRIPTION OF THE DRAWINGS

The above and further advantages of this invention may be better understood by referring to the following description in conjunction with the accompanying drawings, in which like numerals indicate like structural elements and features in the various figures. For clarity, not every element may be labeled in every figure. The drawings are not necessarily to scale, emphasis instead being placed upon illustrating the principles of the invention.

FIG. 3A and FIG. 3B show a top view and a side view, respectively, of one embodiment of a linear batch CVD system according to the invention.

DETAILED DESCRIPTION

The steps of the methods of the present invention can be performed in any order with operable results and two or more steps can be performed simultaneously unless otherwise noted. Moreover, the systems and methods of the present invention may include any of the described embodiments or combinations of the described embodiments in an operable manner.

The present teaching relates to systems and methods for reactive gas phase processing such as CVD, MOCVD and Halide Vapor Phase Epitaxy (HVPE) processes. In conventional reactive gas phase processing of semiconductor materials, semiconductor wafers are mounted in a carrier inside a reaction chamber. A gas distribution injector is configured to face the carrier. The injector typically includes gas inlets that receive a plurality of gases or combinations of gases. The injector directs the gases or combination of gases to the reaction chamber. Injectors commonly include showerhead devices arranged in a pattern that enables the precursor gases to react as close to each wafer surface as possible to maximize the efficiency of the reaction processes and epitaxial growth at the surface.

Some gas distribution injectors include a shroud to assist in providing a laminar gas flow during the CVD process. One or more carrier gases can be used to assist in generating and maintaining the laminar gas flow. The carrier gases do not react with the precursor gases and do not otherwise affect the CVD process. A typical gas distribution injector directs the precursor gases from the gas inlets to targeted regions of the reaction chamber where the wafers are processed. For example, in some MOCVD processes the gas distribution injector introduces combinations of precursor gases including metal organics and hydrides into the reaction chamber. A carrier gas such as hydrogen or nitrogen, or an inert gas such as argon or helium, is introduced into the chamber through the injector to help sustain a laminar flow at the wafers. The precursor gases mix and react within the chamber to form a film on the wafers.

In MOCVD and HVPE processes, the wafers are typically maintained at an elevated temperature and the precursor gases are typically maintained at a lower temperature when introduced into the reaction chamber. The temperature of the precursor gases and thus their available energy for reaction increases as the gases flow past the hotter wafers.

Figure 1:
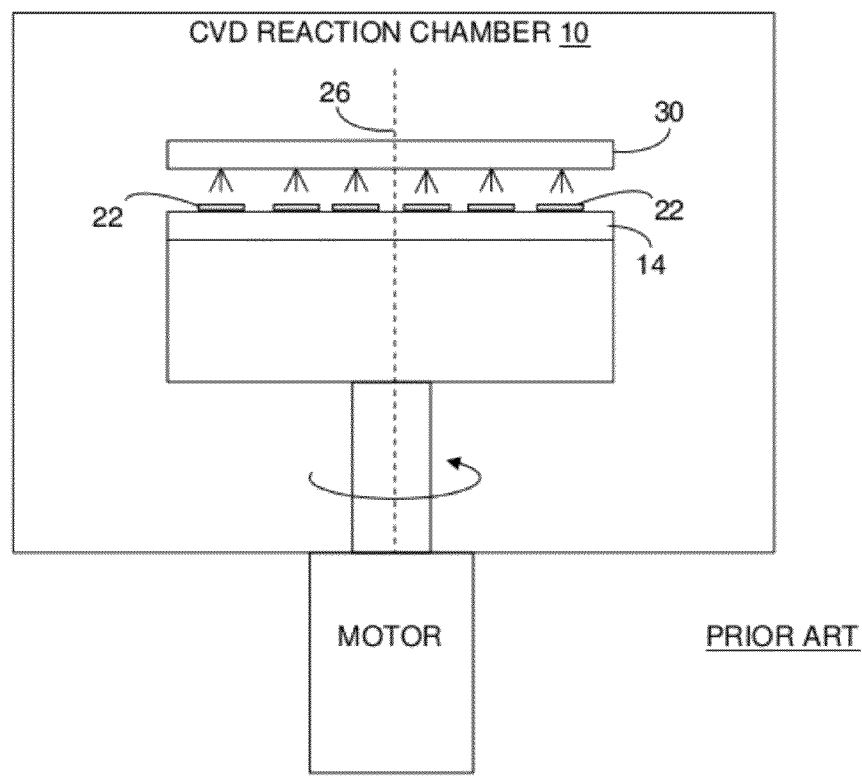
FIG. 1 is an illustration of a CVD reaction chamber as is known in the art.
Figure 2:
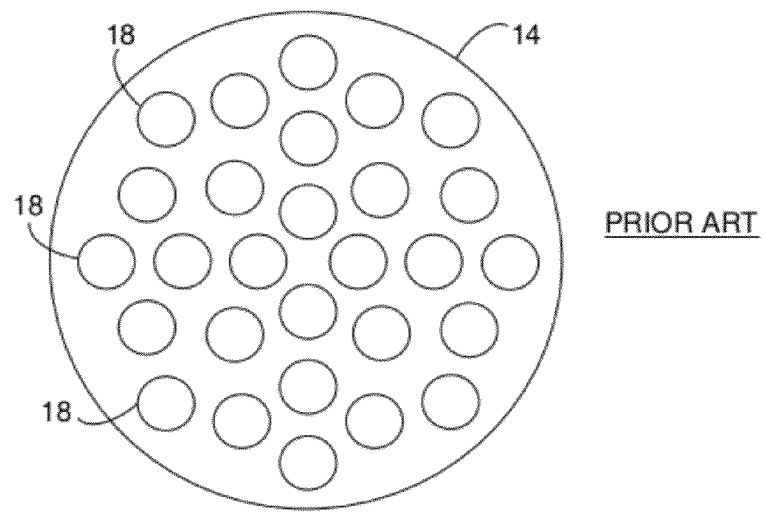
FIG. 2 is an illustration of the wafer carrier of FIG. 1.

One common type of CVD reaction chamber 10 is shown in a side view of a chamber 10 in FIG. 1. The chamber 10 includes a disc shaped wafer carrier 14 shown in an unpopulated state in more detail in the top down view of FIG. 2. The carrier 14 has pockets 18 or other structural features arranged to hold one or more wafers 22 on a top surface. During CVD processing, the carrier 14 rotates about a vertical axis (dashed line 26) that extends perpendicular to the wafer-bearing surface and each wafer 22 is rotated about a wafer axis that is centered on and perpendicular to the wafer surface to achieve planetary motion. Rotation of the carrier 14 and wafers 22 improves the uniformity of the deposited material. During rotation, the precursor gases are introduced into the reaction chamber 10 from a flow inlet element 30 above the carrier 14. The flowing gases pass downward toward the wafers 22, preferably in a laminar plug flow. As the gases approach the rotating carrier 14, viscous drag impels the gases into rotation about the axis 26. Consequently, in a boundary region near the carrier surface and wafers 22, the gases flow around the axis 26 and outward toward the edge of the carrier 14. The gases flow past the carrier edge and then downward toward one or more exhaust ports. Typically, MOCVD process are performed using a succession of different precursor gases and, in some instances, different wafer temperatures, to deposit a plurality of different layers each having a different composition to form a device.

CVD processes are typically limited in batch capacity. For example, achieving uniformity of the deposited film for all substrates in a conventional CVD reaction chamber (e.g., chamber 10 in FIG. 1) is generally difficult, especially as the size of the reaction chamber increases to allow for more substrates to be processed or to accommodate larger substrates. Conventional systems and methods for CVD processing are often inadequate to support high volume processing of wafers and other substrates without sacrificing uniformity of the deposited films or requiring redundant equipment.

The systems and methods of the present invention are suitable for high volume batch CVD processing of substrates. The narrow width of the reaction chamber of the systems enables a uniform distribution of the precursor gases across the substrates along the entire length of the chamber. The number of substrates that can be coated with uniform film thickness and composition during a single CVD process run is scalable and can be substantially larger than the number of substrates processed in a typical CVD reaction chamber. Moreover, complicated motion mechanisms are not required and each substrate is simply rotated about a single substrate axis.

FIG. 3A and FIG. 3B are top and side views, respectively, of an embodiment of a linear batch CVD system 40 according to the present invention. In FIG. 3A, the top down view is from underneath a shower head 44 structure that includes gas injectors 48 as shown in FIG. 3B. The linear batch CVD system 40 includes a deposition chamber 52, substrate carrier 56, vacuum system 60, the shower head 44 and a heating system that includes a heater 64 and a heating control module 68. The substrate carrier 56 includes a plurality of receptacles 72 each configured to receive a substrate 22. In the embodiments describe herein, the substrate 22 is generally described as a wafer, such as a semiconductor wafer; however, it should be recognized that other forms and types of substrates can be used.

The width W of the deposition chamber 52 is substantially narrower than the length L and accommodates only a single row of wafers 22. Although the row is shown as a straight line, the invention contemplates other types of rows in which the wafers 22 are arranged in a curved line or other shape so that the dimension perpendicular to the row at any location is substantially less than the length of the row. For example, the linear configuration can include a batch of wafers 22 arranged along a straight line, a curved line, or any combination of straight line segments and curved line segments. The narrow dimension of the configuration enables a uniform distribution of precursor gases across all the wafers 22 in the batch.

In preparation for a CVD process run, wafers 22 are loaded into respective receptacles 72 in the substrate carrier 56. Loading is preferably performed in an automated manner, for example, by retrieving the wafers 22 from a wafer supply and positioning each wafer 22 into its receptacle 72 using one or more robotic mechanisms disposed near one side of the deposition chamber 52. Similarly, processed wafers 22 can be removed from the receptacles using robotic means.

Figure 4A:
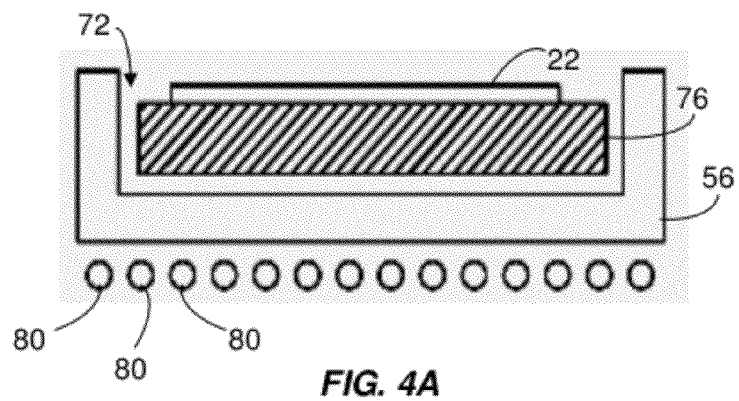
FIG. 4A shows a cross-sectional view through one of the receptacles of the substrate carrier of FIG. 3A and FIG. 3B.

FIG. 4A is a cross-sectional view of the substrate carrier 56 through one of the receptacles 72. Each receptacle 72 includes a recessed region to maintain the position of the wafers 22 within the carrier 56. As illustrated, the wafer 22 is disposed on an intermediate substrate carrier 76 that resides in the receptacle 72. The heater 64 includes a plurality of heating elements 80 positioned near the bottom of the substrate carrier 56 and arranged substantially parallel to the length of the carrier 56. For example, the heating elements 80 may be wires or filament heaters that generate heat while conducting an electrical current. Alternatively, the heating elements 80 may be lamp heaters or RF heaters.

Heat is coupled from the heating elements 80 to the substrate carrier 56 via radiative coupling. In one embodiment, the substrate carrier 56 comprises graphite or another material having a high thermal conductivity to efficiently conduct heat to the wafers 22. Preferably, the heating elements 80 are independently controlled, or are controlled as subsets of the total number of elements. Individual element control or group control allows temperature variations due to radiation loss from the sides of the substrate carrier 56 to be compensated by applying greater heat near the sides of the carrier 56. In an alternative embodiment, the heating elements 80 do not extend the length of the carrier 56, but are instead arranged in zones of shorter lengths that together span nearly the full length of the deposition chamber. The shorter heating zones may be independently controlled in response to temperature measurements at different locations along the length of the deposition chamber to achieve a more uniform temperature environment.

Figure 4B:
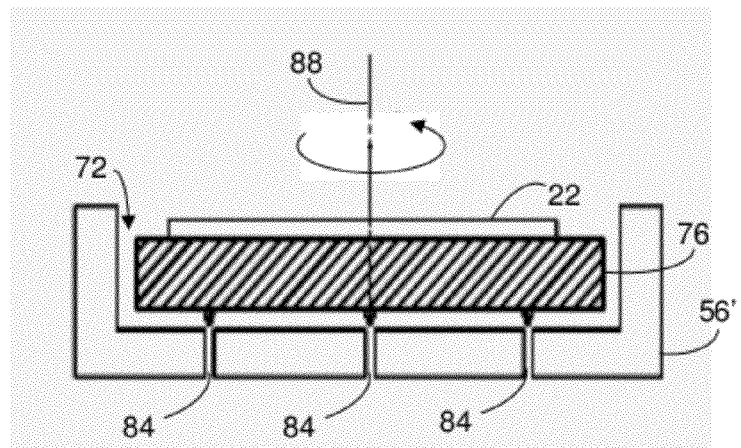
FIG. 4B shows a cross-sectional view of an alternative substrate carrier according to another embodiment of the invention.
Figure 4C:
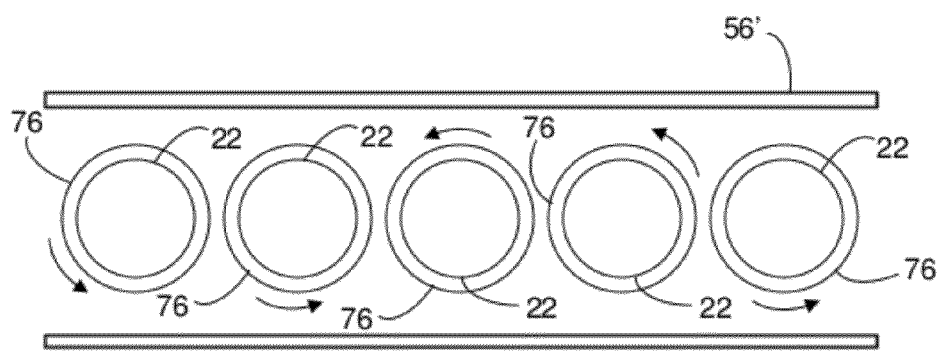
FIG. 4C is a top view of the substrate carrier of FIG. 4B showing rotation of the wafers about a substrate axis.

FIG. 4B illustrates a cross-sectional view of a substrate carrier 56' according to another embodiment. Each receptacle 72 in the substrate carrier 56' has a plurality of air injector channels 84 that, when active, allow gas to flow upward to provide an air bearing support that floats the intermediate substrate carrier 76 and wafer 22. At least some of the air injector channels 84 in each receptacle 72 are configured at a non-zero angle with respect to the vertical axis 88 to impart a rotation to the intermediate substrate carrier 76 about the vertical axis 88 so that each intermediate carrier 76 and wafer 22 rotate as shown in FIG. 4C.

Referring again to FIG. 3B, in various embodiments the CVD system 40 includes one or more sensors to sense the temperature across the wafers. Temperature sensors communicate with the heating control module 68 to enable more accurate control of the wafer temperatures. The temperature sensor can be a pyrometer or other sensor adapted for determining the high temperatures of the wafers 22 during the CVD process. Alternatively, one or more thermocouples disposed on the substrate carrier 56 communicate with the heating control module 68 to provide a feedback signal to enable accurate control of the wafer temperatures.

In another embodiment, the CVD system 40 includes one or more film thickness sensors to determine the thickness of the films being deposited on the wafers 22. The film thickness sensor can be an optical reflectometer or similar measurement system as known in the art.

A temperature sensor and film thickness sensor can be integrated in a single measurement head used to monitor conditions during a CVD process. In one embodiment, a plurality of measurement heads are positioned along the length L of the deposition chamber 52 to obtain temperature and thickness data for a subset of the total number of wafers 22, for example, the measurement heads can be positioned to obtain data for every third wafer 22 in the linear configuration. In an alternative embodiment, a single measurement head having a temperature sensor and a film thickness sensor is mounted to a translation mechanism, such as a linear drive, that enables the measurement head to be moved along the length L of the deposition chamber 52. A window above each wafer 22 enables the moving head to obtain data for each wafer 22. The wafer measurements are used to control the heater 64 and the precursor gas flows.

The showerhead 44 provides a uniform distribution of the precursor gases at the surface of each wafer 22. In a two precursor gas system, the showerhead 44 includes one or more gas injectors for each precursor gas. By way of an example, the precursor gases in a two precursor gas implementation can include trimethylgallium (TMG) and ammonia gases used in the production of gallium nitride (GaN) light-emitting diodes (LEDs).

In some CVD applications where film growth is determined by surface reactions, it is preferable to sequentially activate, or pulse, the precursor gases so that substantially only one gas is present in the deposition chamber 52. Pulsing of the precursor gases in this manner limits the mixing of the gases in the chamber and reduces or eliminates parasitic deposition.

Figure 5:
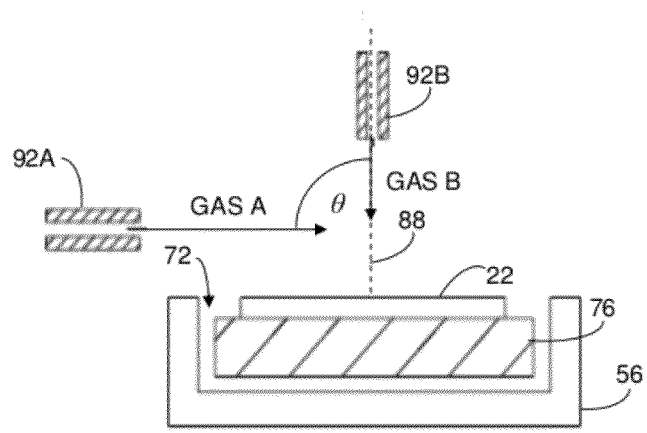
FIG. 5 is a cross-sectional view through a wafer and substrate carrier showing a side view of two injector ports arranged in a perpendicular configuration according to one embodiment of the invention.

FIG. 5 is a cross-sectional view through a receptacle 72 and wafer 22 showing a side view of two injector ports (slots 92 extending into page) arranged in a perpendicular configuration ($\theta=90°$) according to one embodiment. One slot 92A provides a precursor gas (gas "A") in a horizontal flow that is substantially parallel to the wafer surface. The other slot 92B provides a different precursor gas (gas "B") in a vertical flow that is substantially parallel to the axis 88 of the wafer 22. In alternative embodiments, the angle theta between the injector slots 92 is configured to be at a different value in a range from $\theta=0°$ (side by side horizontal flow configuration) to $\theta=90°$.

Figure 6:
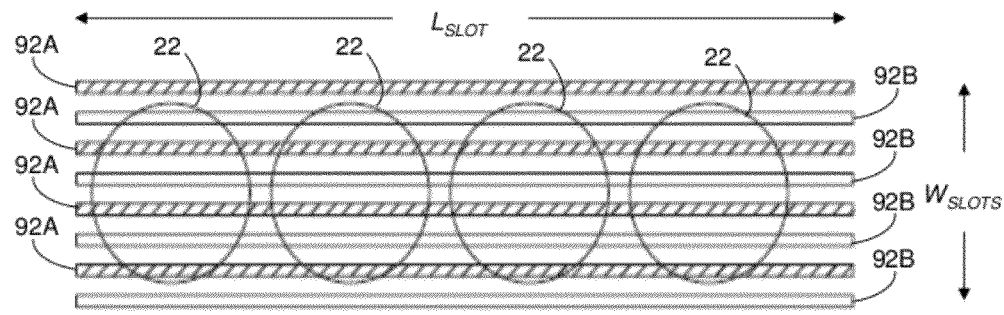
FIG. 6 shows a top view of an arrangement of injector ports according to one embodiment of the invention.

FIG. 6 shows a top view of an arrangement of injector ports 92 with respect to four adjacent substrates 22 according to another embodiment. Each injector port 92 is in the form of a slot, or substantially rectangular opening, and has a length $L_{SLOT}$ that extends parallel to the length L of the deposition chamber 52 (see FIG. 3A). The width $W_{SLOTS}$ of the full arrangement of slots 92 is greater than the diameter of the substrates 22. Precursor gas A is supplied from slots 92A that are spaced in alternating arrangement with slots 92B that supply precursor gas B.

In one embodiment, the lengths $L_{SLOT}$ of the slots 92 are nearly as long as the length of the deposition chamber. In alternative embodiments, the slots 92 are configured in two or more groups so that the lengths $L_{SLOT}$ of the slots 92 in a group is substantially less than the length of the deposition chamber. Injector port grouping is preferable in some configurations having a high batch capacity to enable more uniform precursor gas distribution across the narrow dimension of the deposition chamber. By way of example, the lengths $L_{SLOT}$ of slots in a group can be one meter for a deposition chamber that is several meters in length. In some embodiments, the spacing between adjacent wafers 22 in neighboring groups may exceed the spacing between wafers 22 within the same port group. The precursor gas flows for each group can be independently controlled to enable more uniform deposition of films for the full batch of wafers 22 in the deposition chamber.

Figure 7:
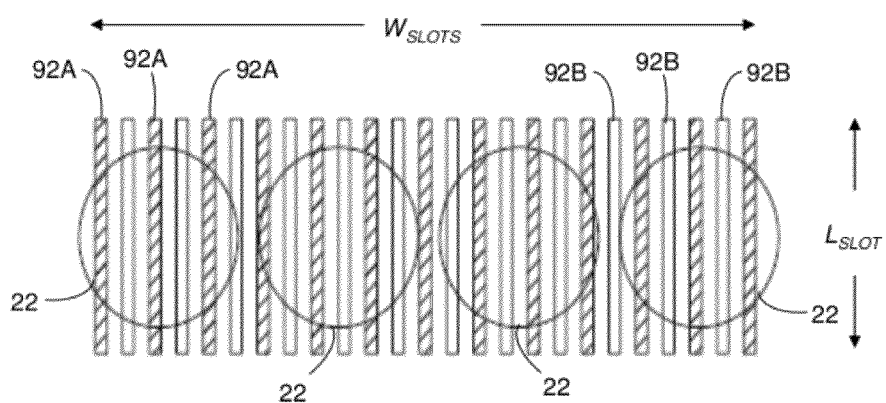
FIG. 7 shows a top view of an arrangement of injector ports according to another embodiment of the invention.

FIG. 7 shows a top view of an alternative embodiment to the slots 92 illustrated in FIG. 6. Each slot 92 has a length $L_{SLOT}$ that extends parallel to the shorter dimension (i.e., the width W shown in FIG. 3A) of the deposition chamber and is greater than the diameters of the wafers 22. The slots 92A and 92B are arranged in alternating position along the length of the deposition chamber. In one embodiment, the full width $W_{SLOTS}$ of the configuration of slots 92 is nearly the length of the deposition chamber. In some alternative embodiments, the slots 92 are arranged in groups each having a group width that is substantially less than the length of the deposition chamber. The spacing between adjacent wafers 22 belonging to neighboring slot groups can exceed the spacing between wafers 22 within a slot group. The gas flow for injector ports in the slot groups can be independently controlled to improve the uniformity of film deposition for all wafers 22 in the deposition chamber.

Figure 8A:
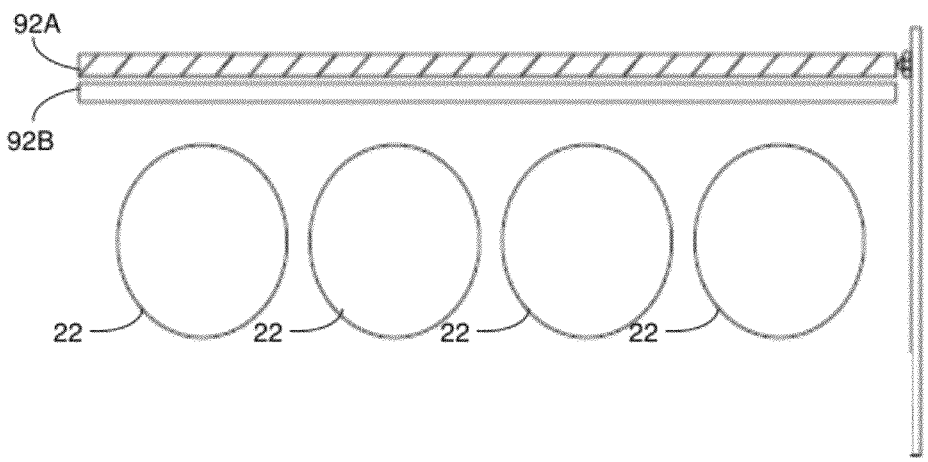
FIG. 8A, FIG. 8B and FIG. 8C show top views of an arrangement of injector ports at various positions according to another embodiment of the invention.
Figure 8B:
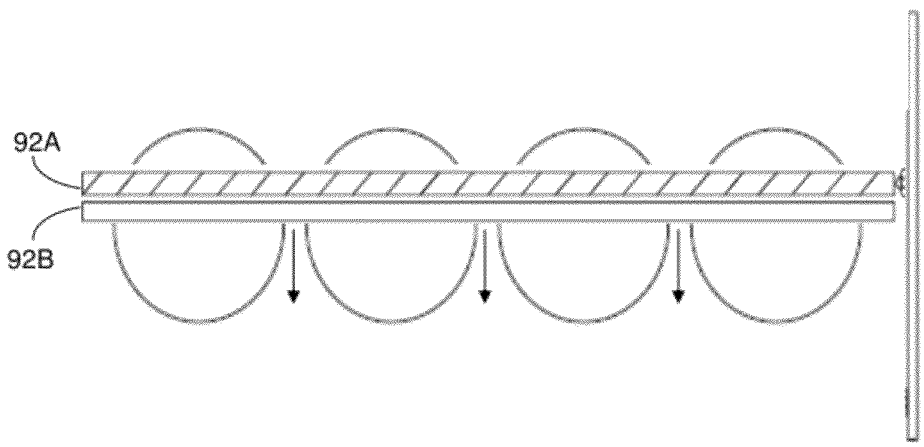
Figure 8C:
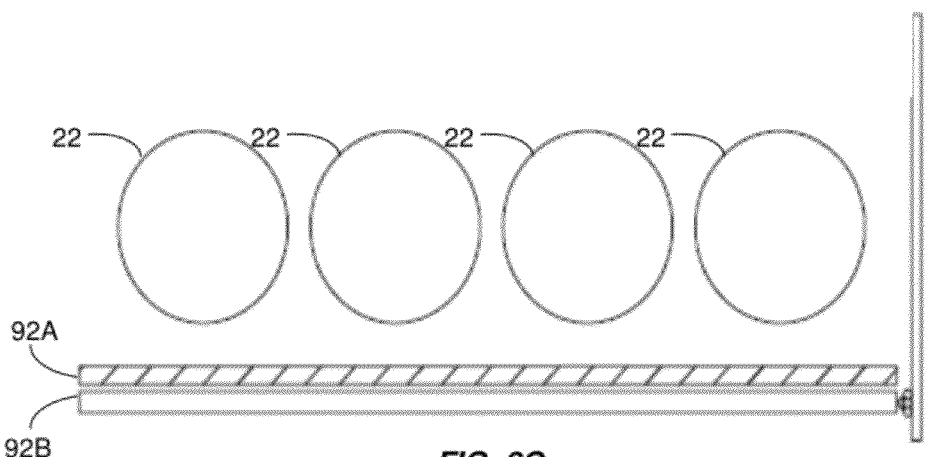

For the gas injector configurations described above, each precursor gas is supplied to the deposition chamber through multiple ports. FIG. 8A shows an alternative configuration in which a single pair of injector ports (i.e., a "port pair") includes one slot 92A to supply precursor gas A and a second slot 92B to supply precursor gas B. During a CVD process run, the port pair is swept in a back and forth motion above the wafers 22 using a translation mechanism such as a single-axis translation stage. For example, the port pair moves from one side of the row of wafers 22 as shown in FIG. 8A, through intermediate positions (for example, as shown in one intermediate position in FIG. 8B), until it reaches a position at the opposite side of the row of wafers 22 as shown in FIG. 8C. The port pair is then translated in a reverse direction until it returns to the position shown in FIG. 8A. The motion of the port pair is repeated in a cyclical manner throughout the CVD process run.

Figure 9:
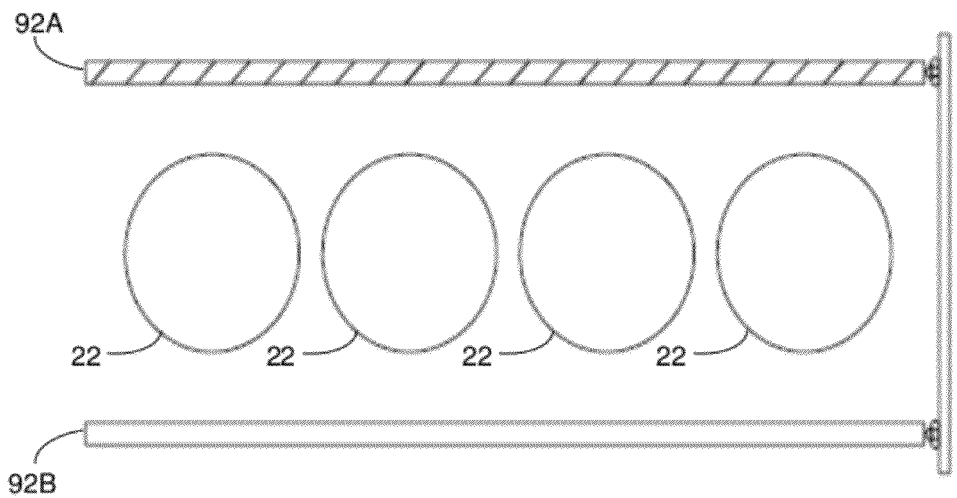
FIG. 9 shows a configuration of injector ports according to another embodiment of the invention.

FIG. 9 shows a configuration of gas injectors according to another embodiment in which one slot 92A that supplies precursor gas A is on an opposite side of the row of wafers 22 from another slot 92B that supplies precursor gas B. During a CVD process run the first slot 92A moves from the illustrated position across the row of wafers 22 until it is adjacent to the second slot 92B. The first slot 92A then translates in a reverse direction until it returns to the illustrated position. The second slot 92B remains stationary when the first slot 92A is in motion.

Once the first slot 92A completes its round trip motion, the second slot 92B is moved from its illustrated position across the row of wafers 22 until it is adjacent to the first slot 92A. The second slot 92B then reverses direction and moves across the wafers 22 until it reaches its illustrated position. The first slot 92A remains stationary while the second slot is in motion. This alternating motion in which the first slot 92A moves and then the second slot 92B moves is repeated throughout the CVD process. In a preferred embodiment, the two precursor gases supplied by the slots 92 are sequentially pulsed so that gas is supplied from a slot only when the slot is in motion so that parasitic deposition is substantially reduced.

Other variations of the phasing of the cyclic motions of the two slots 92 will be apparent to those of skill in the art. For example, one slot 92 may begin its motion before the other slot 92 completes its motion as long as the slots do not interfere with each other.

In the various embodiments described above with respect to FIG. 5 to FIG. 9, the gas injectors include ports 92 that are substantially rectangular or slotted; however, other forms of gas injectors are contemplated. For example, the gas injectors can be in the form of injector tubes uniformly distributed over the substrate carrier 56. Ports can be any of a variety of openings such as holes or various shaped apertures through a sidewall of the tube facing the substrate carrier 56.

Figure 10:
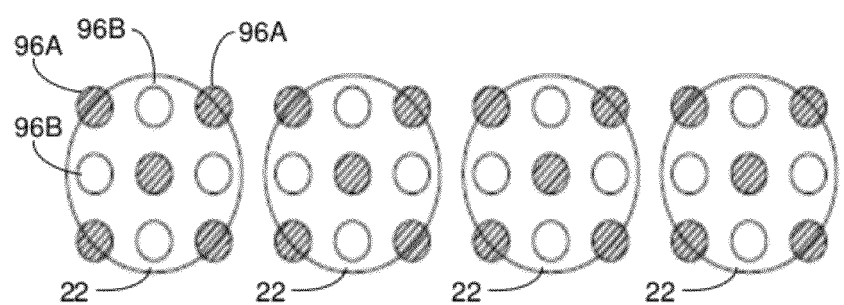
FIG. 10 shows a top view of injector nozzles according to one embodiment of the invention.

FIG. 10 is a top view relating to another embodiment and shows a configuration of injector nozzles 96 with respect to four adjacent wafers 22. The number of nozzles 96 above each wafer 22 may be different and only nine nozzles are shown with each wafer 22 for clarity. Some nozzles 96A supply a first precursor gas (e.g., gas A) and the other nozzles 96B supply a second precursor gas (e.g., gas B) so that a substantially uniform distribution of each gas is present near and at the surface of each wafer 22. In some embodiments, the nozzles 96 are controlled in subsets, or groups, defined for zones for subsets of the total number of wafers 22 arranged along the length of the deposition chamber.

Figure 11:
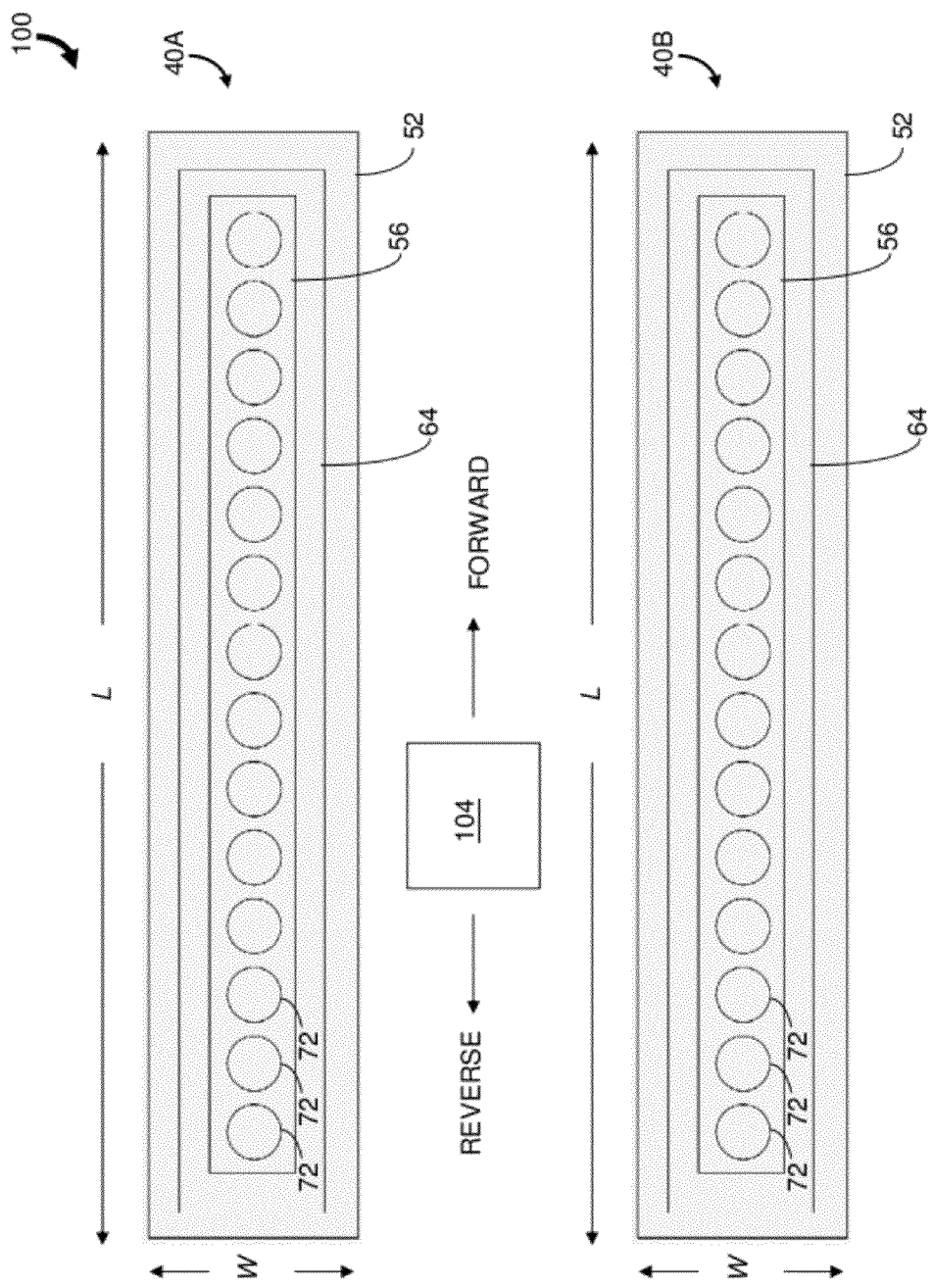
FIG. 11 shows a top view of an embodiment of an embodiment of a parallel batch CVD system according to the invention.

In various embodiments of a linear batch CVD system described above, a single deposition chamber is employed. In alternative embodiments, a batch CVD system in accordance with principles of the invention includes a pair of deposition chambers 40A and 40B in a parallel arrangement as shown in FIG. 11. In the illustrated parallel batch CVD system 100, the deposition chamber 40 has a width W that is substantially less than its length L and encloses a single row of wafers or other substrates in the receptacles 72. As described in embodiments above, the narrow width W of the deposition chamber 40 enables the uniform distribution of precursor gases across all the wafers. A single vacuum pump and heating control module (not shown) is used to provide the vacuum and thermal environments for both chambers 40 although in other embodiments the chambers 40 may utilize separate vacuum pumps or heating control modules.

The parallel batch CVD system 100 includes a robotic loading module 104 located between the two deposition chambers 40. The robotic loading module 104 is configured to translate in a direction parallel to the length L of each chamber 40. The robotic loading module 104 includes at least one cassette for carrying the wafers and a mechanism capable of multiple degrees of motion to enable wafers or other substrates to be retrieved from or loaded into the cassette.

Advantageously, the robotic loading module 104 can service both deposition chambers 40. For example, the robotic loading module 104 can move in a forward direction while retrieving wafers from the cassette and loading the wafers in an alternating manner into the receptacles 72 of both chambers 40. To unload the wafers, the robotic loading module 104 moves in a reverse direction while retrieving wafers from both chambers 40 and loading the original cassette or a second cassette. Alternatively, the robotic loading module 104 can return to its initial position before loading and then move again in the forward direction during the unloading operation for both chambers 40.

In an example of another alternative mode of operation, the robotic loading module 104 moves in a forward direction while retrieving wafers from the cassette and loading the wafers into one of the deposition chambers 40A. After reaching the end of the deposition chamber 40A, the robotic loading module 104 moves in a reverse direction while loading the second deposition chamber 40B. Once the CVD process is completed in the first chamber 40A, the robotic loading module 104 moves again in a forward direction while extracting the processed wafers from the receptacles 72 of the first deposition chamber 40 and loading the cassette with the processed wafers. Subsequently, the robotic loading module 104 moves in the reverse direction while retrieving processed wafers from the second chamber 40B and loading the cassette with the processed wafers.

It should be noted that the CVD processes performed by the two deposition chambers 40 can be the same CVD process. Alternatively, a full CVD process may include initial CVD processing performed by the first deposition chamber 40A and subsequent CVD processing by the second deposition chamber 40B. More specifically, wafers extracted from the first chamber 40A after completion of the initial CVD process are loaded into the second chamber 40B. This transfer between chambers can occur during a single translation of the robotic loading module 104. Alternatively, wafers extracted from the first chamber 40A can be temporarily stored in the cassette during one translation and then removed from the cassette and loaded into the second chamber 40B during a subsequent translation.

Figure 12:
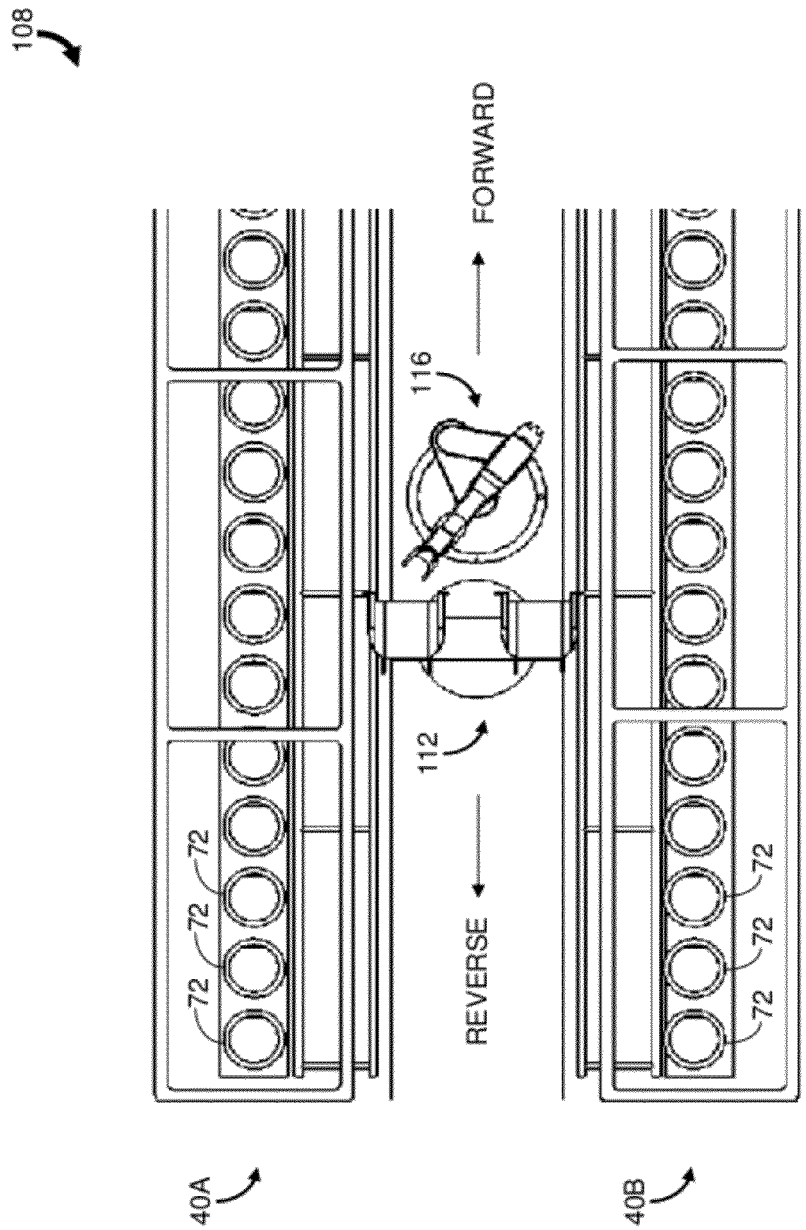
FIG. 12 shows a top view of one end of a parallel batch CVD system.

FIG. 12 shows a top down view of one end of a parallel batch CVD system 108 having a configuration similar to the system 100 of FIG. 11. The robotic loading module 104 includes a cassette 112 for carrying the wafers and an articulating robotic arm 116 capable of rotation and translation. The robotic arm 116 can retrieve wafers from the cassette 112 and load the receptacles 72, and can also retrieve processed wafers from the receptacles 72 and load the cassette 112 (or a second cassette) with the processed wafers.

Prior to initiating a CVD process run, each deposition chamber 40 is opened to provide access to the receptacles 72. For example, the deposition chambers 40 may include a hinged cover that can be pivoted about a hinge axis that is parallel to the lengths L of each chamber to enable access through the chamber side that is closest to the robotic loading module 104. After a deposition chamber 40 is loaded with wafers, the hinged cover is lowered into its closed position to seal the chamber 40. Once the CVD process run is completed, the hinged cover is pivoted about the hinge axis to an open position to allow the processed wafers to be extracted and loaded into the cassette.

While the invention has been shown and described with reference to specific embodiments, it should be understood by those skilled in the art that various changes in form and detail may be made therein without departing from the spirit and scope of the invention as recited in the accompanying claims.

What is claimed is:

1. A parallel batch chemical vapor deposition (CVD) system comprising:
   a pair of linear deposition chambers in a parallel arrangement, each of the linear deposition chambers comprising:
      a plurality of substrate receptacles each configured to receive a substrate, all of the substrate receptacles having a diameter and being arranged in a single row that is parallel to a length of the deposition chamber to hold the substrates in a straight line and horizontal coplanar configuration;
      a showerhead disposed above the substrate receptacles and having a plurality of gas injectors, each of the gas injectors having a port in the shape of a linear slot having a length that is greater than the diameters of the substrate receptacles, each of the linear slots being parallel to the linear slots of the other gas injectors and parallel to the single row of substrate receptacles, each of the gas injectors supplying a different gas through the respective one of the ports toward the substrate receptacles; and
      a heating module for uniformly controlling a temperature of the substrates disposed in the substrate receptacles; and
   a robotic loading module disposed between the linear deposition chambers and configured for movement in a direction parallel to a length of each of the linear deposition chambers, the robotic loading module comprising at least one cassette for carrying a plurality of substrates to be loaded into the substrate receptacles of the linear deposition chambers.

2. The parallel batch CVD system of claim 1 wherein the substrates are semiconductor wafers.

3. The parallel batch CVD system of claim 1 wherein the robotic loading module is configured to alternate loading of the two deposition chambers during translation in one of a forward direction and a reverse direction.

4. The parallel batch CVD system of claim 1 wherein the robotic loading module is configured to load one of the linear deposition chambers during translation in a forward direction and to load the other of the linear deposition chambers during translation in a reverse direction.

* * * * *